United States Patent [19]
Cleeves et al.

[11] Patent Number: 5,830,804
[45] Date of Patent: Nov. 3, 1998

[54] ENCAPSULATED DIELECTRIC AND METHOD OF FABRICATION

[75] Inventors: James M. Cleeves, Redwood City; Krishnaswamy Ramkumar, San Jose, both of Calif.

[73] Assignee: Cypress Semiconductor Corp., San Jose, Calif.

[21] Appl. No.: 673,304

[22] Filed: Jun. 28, 1996

[51] Int. Cl.⁶ .................................................. H01L 21/44
[52] U.S. Cl. ............................................ 438/672; 438/688
[58] Field of Search ...................... 438/672, 675, 438/645, 646, 637, 626, 688

[56] References Cited

U.S. PATENT DOCUMENTS

| | | | |
|---|---|---|---|
| 4,866,008 | 9/1989 | Brighton et al. | 257/762 |
| 4,996,133 | 2/1991 | Brighton et al. | 438/672 |
| 5,219,787 | 6/1993 | Carey et al. | 438/637 |
| 5,380,679 | 1/1995 | Kano | 438/672 |
| 5,409,861 | 4/1995 | Choi | 438/675 |
| 5,518,963 | 5/1996 | Park | 438/637 |
| 5,556,814 | 9/1996 | Inoue et al. | 438/696 |

*Primary Examiner*—Kevin Picardat
*Attorney, Agent, or Firm*—Blakely, Sokoloff, Taylor & Zafman LLP

[57] ABSTRACT

A method of encapsulating a dielectric. According to the method of the present invention, a disposable post is formed over a portion of a substrate. Next, a first dielectric layer is formed over the substrate and the disposable post. A second dielectric layer is then formed over the first dielectric layer. Next, a third dielectric layer is formed over the second dielectric layer. A portion of the third dielectric layer is then removed so as to reveal the disposable post. The disposable post is then removed to form an opening.

16 Claims, 6 Drawing Sheets

ENCAPSULATED DIELECTRIC AND METHOD OF FABRICATION

BACKGROUND OF THE INVENTION

1. Field of the Invention

The present invention relates to the field of semiconductor processing, and more specifically, to a method of encapsulating a dielectric material.

2. Discussion of Related Art

Modern integrated circuits are made up of literally millions of discrete active and passive devices such as transistors, capacitors, and resistors which are electrically coupled together into functional circuits, such as microprocessors, DRAMS, SRAMS, and programmable logic devices by elaborate interconnection structures. As feature dimensions decrease in an attempt to further increase packing density and fabricate even more powerful processors and higher density memories, the use of special interlayer dielectrics, such as spin-on-glasses, polyimides, and low dielectric constant materials is becoming more desirable.

Spin-on-glasses and polyimides are desirable because they are deposited in a liquid state and so provide a relatively simple and cost effective method of planarizing interlayer dielectrics formed between different levels (e.g. metal 1 and metal 2) of interconnections and for filling high aspect ratio gaps created between adjacent lines of the same level of interconnection. Additionally, spin-on materials with low dielectric constants (i.e. materials having a dielectric constant less than the dielectric constant of silicon dioxide) have recently been developed which substantially reduce the capacitive coupling between adjacent lines and thereby enable an even further increase in packing density of conductive lines.

A problem with SOG films, polyimides, and low dielectric constant materials is that they may be sensitive to certain process steps. Thus, these materials may be incompatible with standard integrated circuit (IC) fabrication techniques. An example of a typical IC fabrication process utilizing a SOG layer is illustrated in FIGS. 1a–1c. In a typical process, as shown in FIG. 1a, metal lines or interconnects 102 are formed over a substrate 100. Next, a spin-on-glass (SOG) layer 104 is blanket deposited over the substrate and over and between metal lines 102. Because SOG layer 104 is applied in a liquid state it is able to easily fill in gaps between adjacent metal lines 102 and create a planar topography. After spin-on-glass 104 is deposited, it is generally "cured" by a thermal process to harden the film and further smooth its topography. A capping oxide layer 106 is then generally formed over the cured SOG layer 104.

A photoresist layer 109 is then deposited over capping layer 106 and patterned with well known photolithography techniques to define locations where electrical connections to metal lines 202 are desired. Via openings 108 are then etched through capping oxide 106 and SOG layer 104, as shown in FIG. 1b. A problem with the above described IC process flow is that a portion 110 of SOG layer 104 is exposed in via openings 108. The exposed portions 110 of SOG layer 108 are then susceptible to attack by a subsequent $O_2$ plasma (ashing) used to remove the photoresist layer. It is to be appreciated that spin-on-glass layers and polyimides comprise organic materials, like the photoresist layer being removed, and so are readily etched during the $O_2$ plasma ashing. Lateral etching of SOG layer 104 can lead to short circuits and other reliability problems. Another problem associated with spin-on-glass films and polyimides 104 is that they "outgas" during subsequent thermal processes, such as during the fabrication of an additional level of interconnection. That is, when a metal layer 112 is deposited over capping oxide layer 106 and into via 108 to make an electrical connection with metal lines 102, as shown in FIG. 1c, moisture ($H_2O$) can outgas from SOG layer 104 and corrode (oxidize) the metal formed in the via. (This phenomena is commonly referred to as "via poisoning"). Oxidation can substantially increase the electrical resistance of the metal interconnect and thereby reducing device performance. Oxidation can also cause open circuits resulting in device failure.

As such, present integrated circuit fabrication techniques that utilize SOG films or other sensitive dielectrics that require an etch back which removes the SOG from those areas above metal lines 102 and leaves SOG only between metal lines 102. IC processes which utilize SOG etch back, however, suffer from greater process complexity and other process problems such as, lifting of SOG from the small gaps, etch rate differences between the SOG and initial dielectric layers, and small process margins.

Thus, what is needed is a method of encapsulating an SOG material, or other sensitive dielectric, so that it is protected from attack and is prevented from outgassing during subsequent processing steps.

SUMMARY OF THE INVENTION

The present invention concerns a novel method of encapsulating a dielectric during the formation of an integrated circuit. According to the method of the present invention, a disposable post is formed over a portion of a substrate. Nest, a first dielectric layer is formed over the substrate and the disposable post. A second dielectric layer which is to be encapsulated, is then formed over the first dielectric layer. Next, a third dielectric layer is formed over the second dielectric layer. The top portion of the third dielectric layer is then removed (e.g. etched or polished back) so as to reveal the disposable post. The disposable post is then removed to form an opening through the dielectric layer to the substrate below.

BRIEF DESCRIPTION OF THE DRAWINGS

FIG. 1b is an illustration of a cross-sectional view showing the formation of a via opening through the capping layer and SOG layer of the substrate of FIG. 1a.

FIG. 2b is an illustration of a cross-sectional view showing the formation of a disposable post material over the substrate of FIG. 2a.

DETAILED DESCRIPTION OF THE PRESENT INVENTION

An interconnection structure having an encapsulated dielectric and its method of fabrication is described. In the following description, numerous specific details are set forth, such as specific equipment, materials, and thickness, etc. in order to provide a thorough understanding of the present invention. It will be obvious, however, to one skilled in the art, the present invention may be practiced other than in strict accordance with these specific details. In other instances, well known semiconductor processing equipment and methods have not been described in particular detail in order to avoid unnecessarily obscuring the present invention.

The present invention is an interconnection structure having an encapsulated dielectric and its method of fabrication. According to the present invention, a disposable post is formed over a portion of a substrate where an electrical connection is desired. A sealing dielectric is then deposited over the substrate and adjacent to and over the disposable post. Next, a sensitive dielectric, which is to be encapsulated, is deposited over the sealing dielectric. A capping dielectric is then blanket deposited over the sensitive dielectric. Next, the capping dielectric is polished or etched back to reveal the disposable post. The disposable post is then removed to form an opening where the electrical connection is desired. Although the opening is formed through the dielectric layers, the sensitive dielectric is fully encapsulated between the sealing dielectric and the capping dielectric. As such, the sensitive dielectric is protected from plasma attack and is incapable of "outgassing" and affecting subsequent processing steps. A conductive layer can then be deposited into the opening to make electric contact to the substrate below.

Figure 1A:
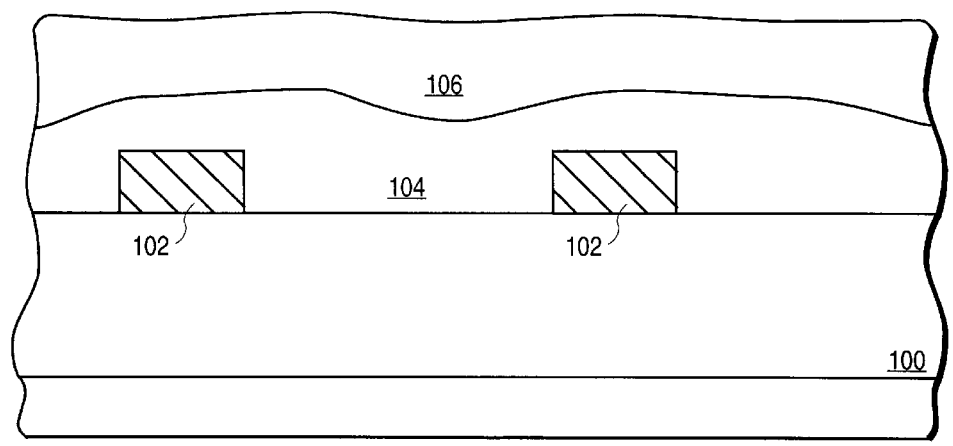
FIG. 1a is an illustration of a cross-sectional view showing the formation of a SOG layer and a capping dielectric layer over a substrate.
Figure 1B:
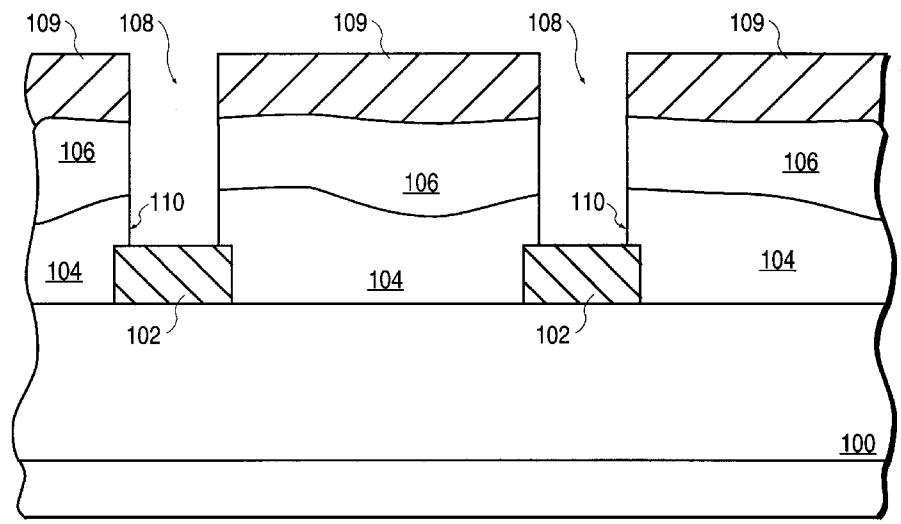
Figure 1C:
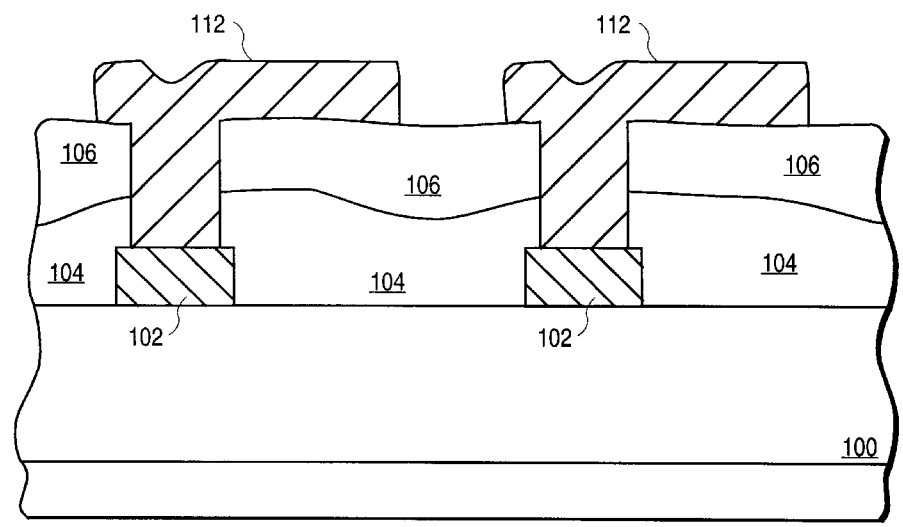
FIG. 1c is an illustration of a cross-sectional view showing the formation of a metal connection in the via opening of the substrate of FIG. 1b.
Figure 2A:
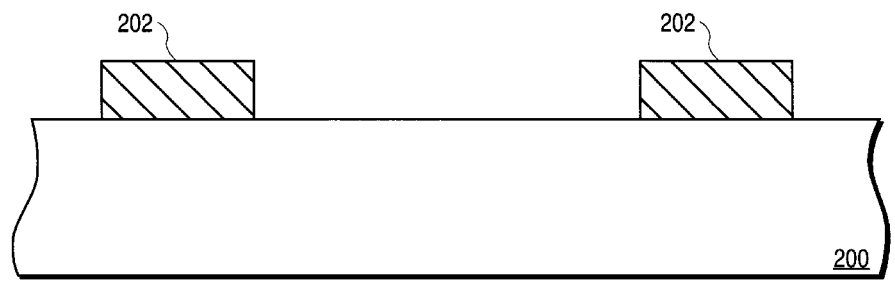
FIG. 2a is an illustration of a cross-sectional view of a substrate having a plurality of conductive lines formed thereon.

According to the present invention, a substrate, such as substrate 200 shown in FIG. 2a, is provided. Substrate 200 is typically a semiconductor substrate such as, but not limited to, silicon, silicon germanium, and gallium arsenide, but may be other types of substrate such as, but not limited to, sapphire substrates, semiconductor-on-insulator (SOI) and substrates used for flat panel displays. Substrate 200 may have a plurality of discrete active and passive devices, insulative layers, and metal interconnects formed thereon. For the purposes of the present invention, a substrate is defined as the body on which the materials of the present invention are deposited and on which the processes of the present invention act. FIG. 2a is an illustration of a substrate 200 having a plurality of conductive lines 202 such as, but not limited to, metal silicides, aluminum, titanium, zirconium, copper, polysilicon (which may be conventionally doped), tungsten, molybdenum, chromium, silver, gold or an alloy thereof, formed thereon. Conductive lines 202 are typically metal interconnects used to couple together discrete devices of substrate 200. Conductive lines 202, however, may provide other functions such as capacitor electrodes, gate electrodes, emitters, bases, etch stops, adhesives, and contacts, etc. For illustrative purposes of the present invention, conductive lines 202 may be part of a first level of metallization (metal 1) and may have a thickness between 5000–10,000 Å.

Figure 2B:
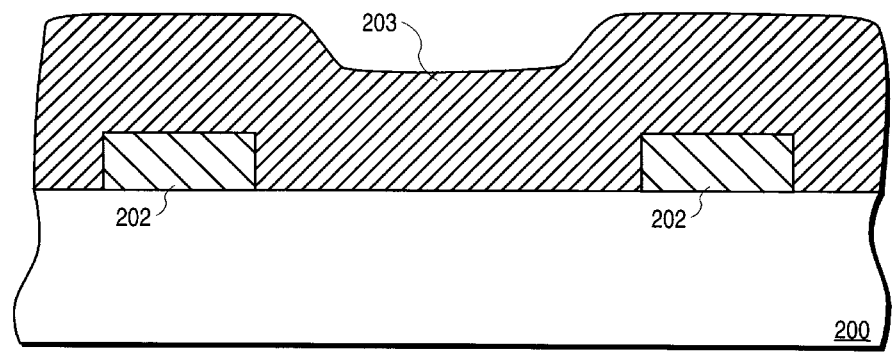

According to the present invention, the first step is to blanket deposit a disposable post material 203 over substrate 200 and conductive lines 202, as shown in FIG. 2b. Disposable post material 203 is preferably photoresist, but maybe other materials, such as polysilicon or polyimides, which can be selectively removed with respect to conductive lines 202 and with respect to subsequently deposited sealing and capping dielectrics. Disposable post material 203 should be formed to a thickness at least as thick as the desired thickness of the interlayer dielectric (ILD) to be formed between conductive lines 202 and a subsequently formed conductive layer (e.g. ILD thickness between metal 1 and metal 2). Any suitable method may be utilized to deposit disposable post material 203. For example, if disposable post material 203 is a photoresist, or a polyimide, it can be spun on, and if disposable post material is polysilicon, it can be deposited by sputtering or chemical vapor deposition.

Figure 2C:
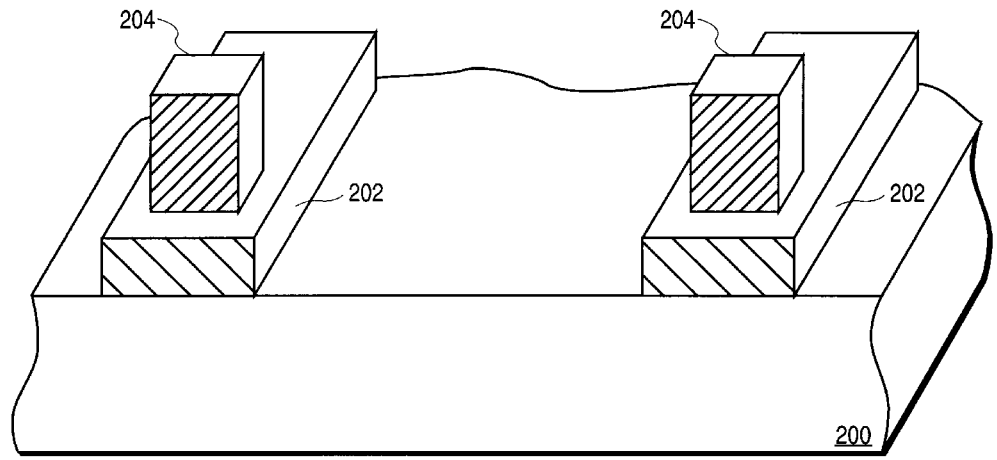
FIG. 2c is an illustration of a cross-sectional view showing the formation of a disposable post from disposable post material of the substrate of FIG. 2b.
Figure 2D:
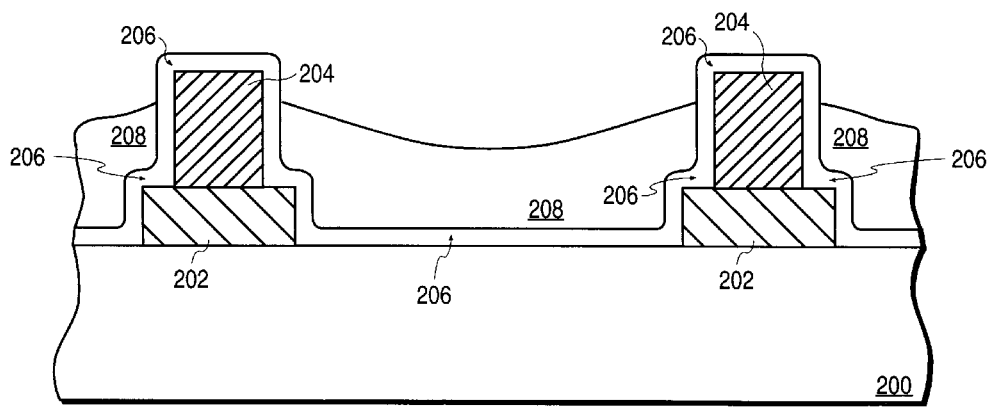
FIG. 2d is an illustration of a cross-sectional view showing the formation of a sealing dielectric and a sensitive dielectric over the substrate of FIG. 2c.

Next, as shown in FIG. 2c, disposable post material 203 is patterned into disposable posts 204. Disposable posts 204 are formed over those portions of conductive lines 202 where electrical contacts are desired. It is to be appreciated that although disposable posts 204 are shown on conductive lines 202, they need not necessarily be formed on conductive lines 202 and may be formed on substrate 200 if a contact to substrate 200 is desired. If disposable post material 203 is a photoresist or other light imagable material, such as a photoimagable polyimide, it can be directly patterned by masking, exposing, and developing with well known techniques. If disposable post material 203 is polysilicon or some other type of non-light imagable material, it can be patterned with well known photolithography techniques. That is, a photoresist layer can be deposited over disposable post material 203 and then masked, exposed, and developed to define locations in the photoresist layer where disposable posts are desired. The disposable post material 203 can then be etched, with well known techniques, such as reactive ion etching, in alignment with the patterned photoresist layer to form disposable posts 204. FIG. 2c is a slightly angled view of the substrate shown in FIG. 2b to better illustrate the shape and placement of disposable posts 204 and conductive lines 202.

Next, a sealing dielectric layer 206 is blanket deposited over substrate 200, conductive lines 202, and over the top and around the sides of disposable post 204, as shown in FIG. 2b. Sealing dielectric 206 is deposited adjacent to and completely surrounds disposable posts 204. Sealing dielectric 206 is formed of a material and to a thickness which will suitably protect a subsequently deposited sensitive dielectric from chemicals and/or etchants utilized to strip disposable post 204 and clean the resulting openings. Sealing dielectric 206 should also be able to prevent subsequent "outgassing" or contamination of the sensitive dielectric. A 1000–2000 Å plasma oxide may be deposited by atmospheric chemical vapor deposition (APCVD), plasma enhanced chemical vapor deposition (PECVD), or low pressure chemical vapor deposition (LPCVD) and used as sealing dielectric 206. Additionally, if a hermetic seal is desired, then silicon nitride can be used as sealing dielectric 206. If conductive lines 202 are part of a lower level of metallization (e.g. metal 1) then it may be desirable to make sealing oxide 206 a silicon rich oxide in order to help control the threshold voltages of devices formed below in substrate 200.

Next, a dielectric 208 which is to be encapsulated, is deposited over sealing dielectric 206, as shown in FIG. 2b. Dielectric 208 is preferably a sensitive dielectric such as, but not limited to, spin-on glass, polyimides, and low K materials which must be encapsulated in order to prevent their attack and/or outgassing during subsequent processing steps, such as disposable post removal $O_2$ plasma cleaning and metal deposition. Dielectric 208 is preferably applied in a liquid state to enable good gap fill between adjacent conductive lines 202. In this way, high aspect ratio openings (e.g., aspect ratio>3:1) can be easily filled enabling increased packing density of metal lines 202. Any well known spin-on-glass such as, but not limited to, Allied 211 and/or Allied 311, can be used if desired. Additionally, a low dielectric constant (low K) material such as, but not limited to, a polyimide or methylsilsesquioxone (sold under the trade name Allied Flare) can be used. According to the present invention, a low K material is defined as a material which has a dielectric constant below that of silicon dioxide (3.6–4.0). Utilizing a low K material reduces the capacitive coupling between adjacent conductive lines 202 which allows for increased packing density. Any suitable method can be utilized to deposit sensitive dielectric 208. It is to be appreciated that in order to adequately encapsulate sensitive dielectric 208, sensitive dielectric 208 must be of a material and deposited by a method which allows sensitive dielectric 208 to settle down below the level of disposable post 204. That is, after deposition (and any thermal processing) sensitive dielectric 208 must have a height above substrate 200 which is less than the height of disposable post 204 above substrate 200

After depositing the sensitive dielectric 208, substrate 200 can be subjected to a thermal process, if desired. If the sensitive dielectric is a spin-on-glass or a polyimide, then the thermal process is used to "cure" the film. Curing is used to harden or densify the spun-on liquid material by driving solvents and water from the film. Curing helps stabilize the film and prevent subsequent outgassing of the film. If the sensitive dielectric is a SOG film, it can be cured by heating at a temperature between 350°–450° C. in a nitrogen ambient for about 1–180 minutes, preferably 10–60 minutes, more preferably about 30 minutes. If the sensitive dielectric is a polyimide, it can be cured by heating at a temperature of about 300° C. for 1–240 minutes, preferably 10–120 minutes, more preferably approximately 60 minutes. Additionally, if the sensitive dielectric 208 is a "flowable" material, the thermal process or an additional thermal process can be used to flow the dielectric and further planarize the film, as shown in FIG. 2e.

Figure 2E:
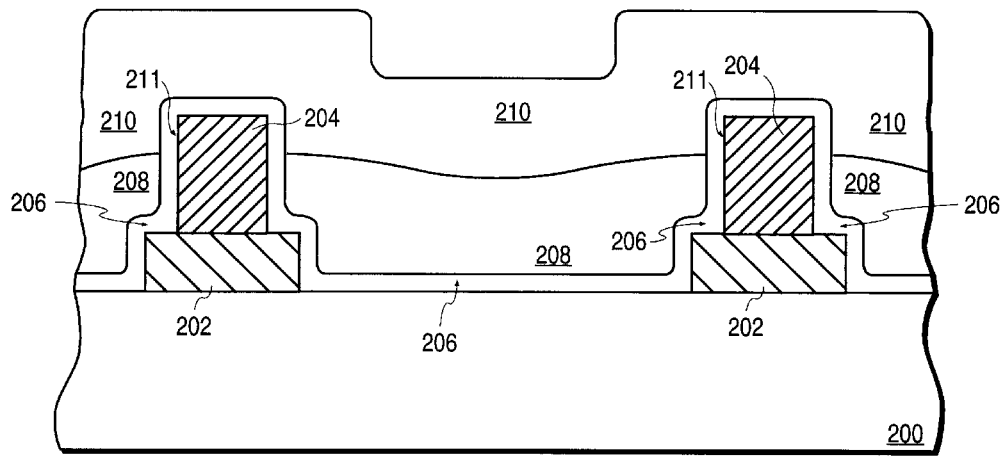
FIG. 2e is an illustration of a cross-sectional view showing the formation of a capping dielectric over the substrate of FIG. 2d.

Next, a capping dielectric layer 210 is blanket deposited onto sensitive dielectric 208 and onto sealing dielectric 206 formed on the top surface of disposable post 204, as shown in FIG. 2e. It is to be noted that capping layer dielectric 210 is formed adjacent to and surrounds sealing oxide 206 formed adjacent to the top portion 211 of the sidewalls of disposable post 204. Capping dielectric layer 210 is preferably an oxide layer deposited by a plasma CVD process. Other well known dielectrics and deposition techniques, however, may be utilized for capping layer 210. Capping dielectric layer 210 is formed of a material which can protect sensitive dielectric 208 from subsequent process steps such as, post removal, solvent cleans, ashing, and metal deposition.

Figure 2F:
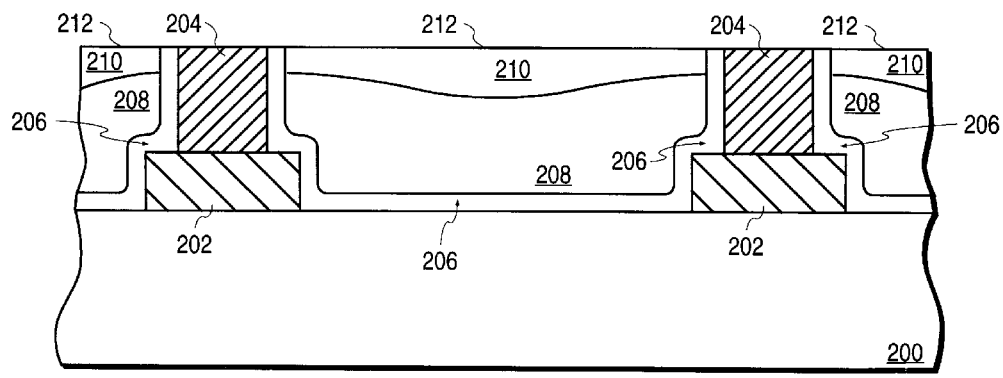
FIG. 2f is an illustration showing the removal of a portion of the capping dielectric from the substrate of FIG. 2e.

Next, a portion of capping dielectric layer 210 is removed, as shown in FIG. 2f, to reveal disposable post 204. The top portion of capping dielectric layer 210 is preferably removed by chemical mechanical polishing with well known equipment and slurries. Polishing is preferred because it generates an extremely planar surface 212, as shown in FIG. 2f, which improves subsequent photolithography and metal deposition steps. Additionally, a planar interlayer dielectric enables multiple levels of metallization (more than four levels of metal) to be included in an IC. Capping dielectric layer 210 should be initially formed thick enough to provide margin for the polishing step and still ensure that a suitable protective capping layer remains after polishing. It is to be appreciated that although polishing is preferred in the present invention due to the extremely smooth and planar topography that results, other methods such as plasma etch back can be utilized to expose disposable post 204.

Figure 2G:
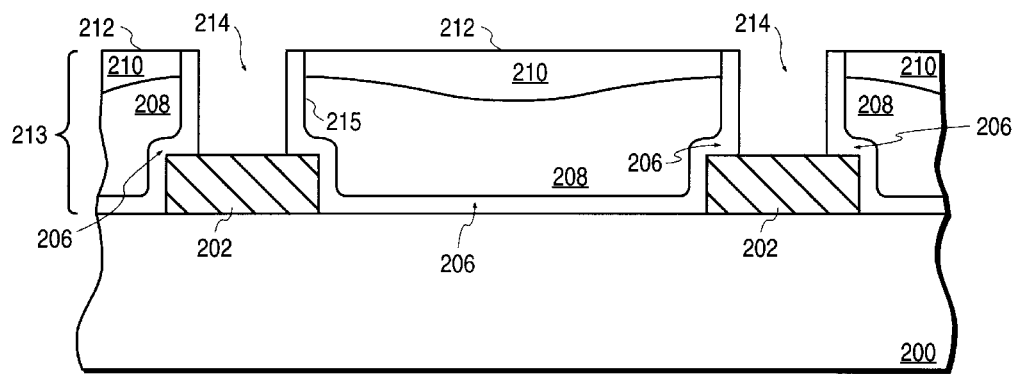
FIG. 2g is an illustration showing the removal of the disposable post from the substrate of FIG. 2f.

Next, disposable post 204 is removed to create an opening 214 as shown in FIG. 2g. Disposable post 204 can be removed with any well known method which can preferentially etch the disposable post material without significantly etching capping dielectric layer 210, sealing dielectric layer 206, and conductive line 202. If disposable post 214 is photoresist or some other type of organic material, it can be removed with well known solvents and an $O_2$ plasma ashing. If the disposable post is polysilicon, and dielectrics 206 and 208 are oxides, then disposable post can be removed by plasma etching with a fluorocarbon and/or fluorohydrocarbon which may be mixed with an inert gas (e.g., comprising $CF_4$, $CH_xF_y$, and/or $C_2H_aF_b$, where x=1 or 2, y=2 or 3 and x+y=4, and $O \leq a \leq 4, 2 \leq b \leq 6$ and a+b=6).

After the removal of disposable post 204, as shown in FIG. 2g, contact openings 214 have been formed through an interlayer dielectric (ILD) 213 which comprises sealing dielectric 206, sensitive dielectric 208, and capping dielectric 210. As is readily apparent from FIG. 2g, sensitive dielectric 208 is fully encapsulated between sealing dielectric 206 and capping dielectric 210. It is to be appreciated that contact opening 214 is completely lined by sealing dielectric 206. In this way, sealing dielectric 206 encapsulates or seals the sides 215 of sensitive dielectric 208 preventing attack from $O_2$ plasmas and chemicals (solvents) used to remove disposable posts 204 and clean opening 214. Additionally, sealing dielectric 206 prevents subsequent outgassing through sidewalls 215 of sensitive dielectric 208. Capping dielectric 210 protects against attack and prevents outgassing of the top surface of sensitive dielectric 208. With the method of the present invention, a sensitive dielectric can be fully encapsulated between two dielectric layers without the need for difficult etch back of the sensitive dielectric. In this way, high performance sensitive dielectric materials such as, spin-on-glasses, polyimides, and low K materials, can be reliably incorporated into present integrated circuit manufacturing processes.

It is to be noted that the depth of opening 214 is dictated by the height of disposable post 204 after polishing. As such, the disposable post material 203 should be initially deposited to a thickness which is the depth desired for opening 214 plus some additional amount which is removed during the polishing of capping layer 210. That is, disposable post material 203 should be deposited thicker than the depth desired of opening 214 in order to provide margin for the planarization process. Additionally, the total thickness of planarized composite interlayer dielectric 213 above substrate 200 should be approximately equal to the thickness of conductive lines 202 plus the desired via opening depth.

Figure 2H:
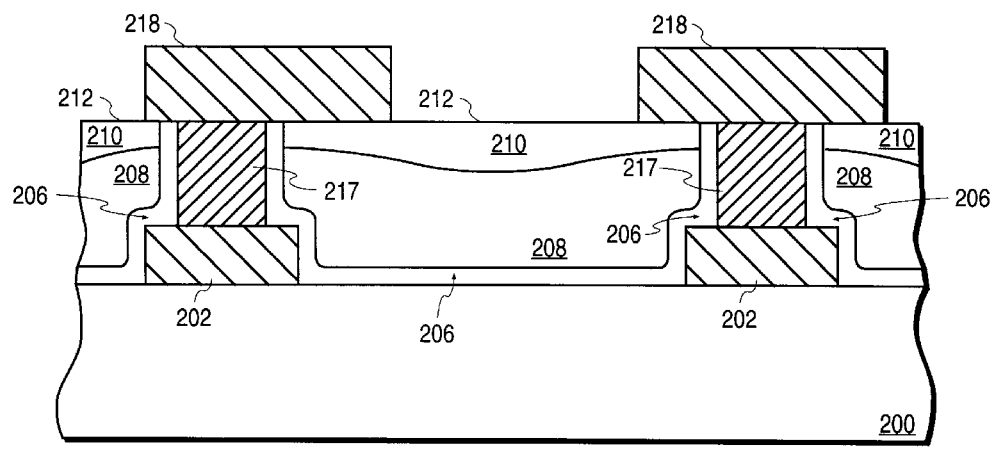
FIG. 2h is an illustration showing the formation of a conductive layer on the substrate of FIG. 2g.

At this time, the process of the present invention is complete. Any well known method can now be utilized to form electrical contacts to conductive lines 202. For example, as shown in FIG. 2h, conductive plugs 217 can be formed in openings 214 by blanket depositing a metal layer such as, tungsten over capping layer 210 and into and filling openings 214. The tungsten layer can then be polished or etched back from the surface 212 of capping layer 210 to form plugs 217. A conductive layer (metal 2) of, for example, aluminum can then be blanket deposited over capping layer 210 and plugs 217 and patterned into a second level of interconnects 218. In this way, conductive plugs or vias 217 provide electrical connection between conductive lines 202 and 218. If desired, instead of forming conductive plugs 217, one can directly deposit into opening 214 the metallization utilized to form interconnects 218.

A method of encapsulating a spin-on-glass layer used in an interlayer dielectric of an integrated circuit formed on a semiconductor substrate, the method comprises the steps of: depositing a photoresist layer over a semiconductor substrate and over a plurality of metal lines formed on the semiconductor substrate; patterning the photoresist layer to form a photoresist post on one of the plurality of metal lines; blanket depositing by chemical vapor deposition a sealing oxide layer over the substrate and the plurality of metal lines, and over and around the photoresist post; spinning on a glass layer over the sealing oxide layer; curing the spin-on-glass layer; blanket depositing a capping oxide layer by chemical vapor deposition; chemical-mechanical polishing the capping oxide layer to reveal the photoresist post; removing the photoresist post to form an opening over the one of the plurality of metal lines; and depositing a conductive material over the capping layer and on the one of the plurality of metal lines in the opening.

A method of encapsulating a sensitive dielectric in an integrated circuit manufacturing process has been described. Although the present invention has been described with respect to encapsulating a sensitive dielectric utilized as part of an ILD between metal 1 and metal 2, the present invention is equally applicable to the fabrication of ILDs between higher levels of metallization (e.g. metal 2 and metal 3, etc., and between substrate 200 and metal 1). In fact, the method of the present invention can be used in any fabrication process which requires a formation of an opening through a material which is sensitive or vulnerable to subsequent process steps. As such, the description of the present invention is to be taken as illustrative rather than limiting wherein the scope of the present invention is to be determined by the appended claims which follow.

We claim:

1. A method of encapsulating a dielectric, said method comprising the steps of:

forming a post over or on a substrate;

forming a first dielectric layer over or on said substrate and said post;

forming a second dielectric layer over or on said first dielectric;

forming a third dielectric layer over or on said second dielectric layer;

removing at least a portion of said third dielectric layer to reveal said post; and removing said post to form an opening.

2. The method of claim 1 wherein said portion of said third dielectric layer is removed by plasma etching.

3. The method of claim 1 wherein said portion of said third dielectric layer is removed by chemical-mechanical polishing.

4. The method of claim 1 wherein said second dielectric layer is a spin-on-glass layer.

5. The method of claim 1 wherein said second dielectric layer is a polyimide.

6. The method of claim 1 wherein said second dielectric layer is a material having a low dielectric constant.

7. The method of claim 1 further comprising the step of:

after depositing said second dielectric layer, subjecting said second dielectric layer to a thermal process.

8. The method of claim 1, wherein said semiconductor substrate further comprises a conductive line, said method comprising the steps of:

depositing a post material over or on a semiconductor substrate and said a conductive line; and patterning said post material to form said post on said conductive line;

wherein removing said post forms an opening over said conductive line.

9. The method of claim 8 further comprising the step of:

depositing a conductive material into said opening over said conductive line.

10. The method of claim 8 further comprising the step of:

heating said second dielectric after forming said second dielectric layer and prior to forming said third dielectric layer.

11. The method of claim 8 further comprising the step of:

after removing said post and prior to depositing said conductive material, exposing said opening to an $O_2$ plasma.

12. The method of claim 8 wherein said post material is photoresist.

13. The method of claim 8 wherein said first dielectric layer is an oxide formed by atmospheric pressure chemical vapor deposition.

14. The method of claim 8 wherein said first dielectric layer is an oxide formed by low pressure chemical vapor deposition.

15. The method of claim 8 wherein said first dielectric layer is an oxide formed by plasma enhanced chemical vapor deposition.

16. The method of claim 8 wherein said first dielectric layer is silicon nitride.

* * * * *